Dec. 17, 1963 A. I. PRESSMAN 3,114,846

SELF-RESETTING TUNNEL DIODE-TRANSISTOR HYBRID PULSE CIRCUIT

Filed Aug. 14, 1961

INVENTOR.
ABRAHAM I. PRESSMAN
BY John V. Regan
ATTORNEY 3,114,846

SELF-RESETTING TUNNEL DIODE-TRANSISTOR HYBRID PULSE CIRCUIT

Abraham I. Pressman, Elkins Park, Pa., assignor to Radio Corporation of America, a corporation of Delaware Filed Aug. 14, 1961, Ser. No. 131,128
6 Claims. (Cl. 307—88.5)

This invention relates to pulse circuits which employ the combination of a transistor and a negative resistance diode.

Pulse circuits are used extensively in information handling systems, digital computers for example, for performing various logical operations and related functions. It has been suggested that negative resistance diodes, tunnel diodes in particular, be used in such systems as active circuit elements because of their high speed switching and current gain capabilities. A tunnel diode can be used as the logical threshold element and a transistor may provide directionality of information flow, gain and inversion. Alternatively, standard gates may be used to perform logic and the combination of a tunnel diode and transistor may be used primarily as a directional amplifier.

It is desirable that the tunnel diode-transistor combination have gain in the forward direction when an input signal is applied and an equal gain when the input signal is terminated. Most prior art tunnel diode circuits fail in this respect. They are either bistable, requiring an auxiliary, high power reset signal to drive the circuit back to its initial state when the input signal is removed or, if the output does follow the inputs, the ratio of output current change to input current change is much less for one polarity input change than for the opposite polarity change.

It is an object of this invention to provide a tunnel diode-transistor pulse circuit which has improved operating characteristics.

It is another object of this invention to provide improved tunnel diode-transistor pulse circuits which are self-resetting.

It is still another object of the invention to provide improved self-resetting pulse circuits which make use of the high speed switching and current gain properties of a tunnel diode and the amplifying, directional and threshold properties of a transistor.

These and other objects of the present invention are accomplished by the combination of a tunnel diode and an inductor serially connected, in the order named, between the common electrode of, and the input electrode of, a transistor. A source of substantially constant current is connected at the common junction of the tunnel diode and the inductor. The magnitude of this current is such that a static load line is provided which intersects the volt-ampere characteristic of the tunnel diode in both regions of positive resistance. Input pulses are applied at the common junction aforementioned. The circuit is self-resetting when the *L/R* time constant of the inductor is greater than the RC time constant (provided by the internal resistance and intrinsic or distributed capacity) of the tunnel diode and less than the duration of the applied input pulses.

In the accompanying drawing, like reference characters refer to like components and:

In the design of logic circuits there is a choice to be made regarding the function that each component performs. A transistor is capable of current gain, voltage gain, directionality and inversion, and also has threshold properties. A tunnel diode generally provides current gain at speeds higher than the transistor and has a sharp current threshold. The choice of functions performed by the elements narrows considerably when common base transistors are employed. The transistor in this configuration provides no current gain and therefore reliance is placed on the tunnel diode for the current amplification to permit reasonable fan-out. By "fan-out" is meant the number of output circuits or loads which can be driven by the transistor circuit. The choice that then remains is whether to use the tunnel diode as the logic threshold element or to use standard diode gates to perform the logic and tunnel diode-transistor combination primarily to provide amplification. In either case, it is desirable that the circuit be self-resetting, that is to say, that the circuit return to its initial operating state at the termination of the applied input pulse or pulses.

Figure 1:
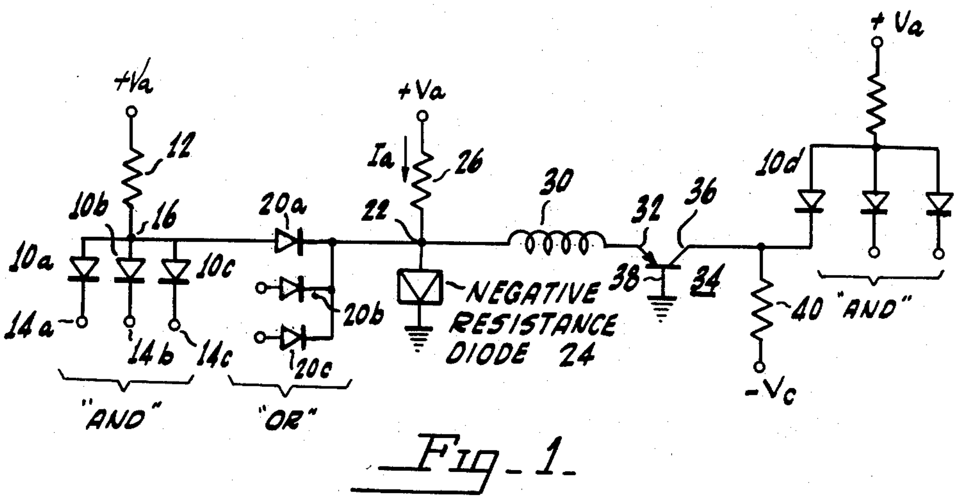
FIG. 1 is a schematic diagram of a pulse circuit wherein the tunnel diode-transistor combination is used primarily to provide amplification.

FIG. 1 is a schematic diagram of a circuit which is self-resetting and in which the tunnel diode is employed primarily as a current amplifying device, although it will be apparent from a later discussion that the tunnel diode threshold is important to the operation of the circuit. Input diodes 10*a*, 10*b* and 10*c* have their anodes connected in common to a current source comprising a resistor 12 and a source of voltage, designated $+V_a$. Each 10*a* . . . 10*c* is connected to a different input terminal 14*a* . . . 14*c*, respectively. This combination functions logically as an "and" gate. The voltage at the common anode junction 16 is low, relatively speaking, whenever one or more of the inputs applied at the input terminals 14*a* . . . 14*c* is low. The voltage at the junction 16 is high, relatively speaking, only when all of the inputs are high. This type of operation will be recognized as that of an "and" gate. The output of the "and" gate is connected to the anode of a diode 20*a*. The cathode of the diode 20*a* is connected to a junction point 22 at the anode of a negative resistance diode 24. Diodes 20*b* and 20*c* also have their cathodes connected to the common junction point 22. The anodes of these diodes 20*b*, 20*c* may be connected to other "and" gates of the type described. The diodes 20*a* . . . 20*c* may perform one of several logical operations, depending upon the parameters of the negative resistance diode 24 and the current source connected at the anode thereof. In particular, the diodes 20*a* . . . 20*c* may function as an "or" gate, and will be so described hereinafter.

The anode of the negative resistance diode 24, which is preferably a tunnel diode, is connected by way of a resistor 26 to a source of voltage, designated $+V_a$. The combination of the latter voltage source and the resistor 26 serves as a source of substantially constant current $I_a$. An inductor 30 is connected between the common junction point 22 and the emitter electrode 32 of a grounded base, PNP transistor 34, whereby the tunnel diode 24 is effectively connected in parallel with the emitter-base diode of the transistor 34. The collector electrode 36 is normally reverse-biased with respect to the grounded base electrode 38 by connecting the collector electrode 36 to a source of biasing potential, designated $-V_c$, by way of a resistor 40. The other terminal of the biasing source, which may be a battery (not shown), is connected to circuit ground. The output of the transistor 34 is illustrated as being supplied to the cathode of a diode 10*d*, which may be part of an "and" gate of the type described previously.

An "or" gate may be defined as one having two or more inputs and one output, in which the output is energized whenever any one or more of the inputs is energized. In FIG. 1, the input to the diode 20*a* may be considered as being energized whenever the output of the "and" gate at the comon point 16 is high, relatively speaking. That is to say, the input to the diode 20*a* is energized whenever the "and" gate is energized by "high" inputs at all of the input terminals 14*a* . . . 14*c*. In like manner, the inputs to the other diodes 20*b*, 20*c* are energized when the voltages at the anodes thereof are high. A current ΔI is supplied to the common junction point 22 through the diode 20*a* whenever the input to the diode 20*a* is energized. It is desired that an output be provided at the collector electrode 36 of the transistor 34 in response to this input.

Consider now the operation of the tunnel diode 24-transistor 34 combination. The volt-ampere characteristic of the tunnel diode 24 is indicated by the solid curve 50 in FIG. 2. The volt-ampere characteristic of the transistor, looking into the emitter 32, is indicated by the dashed curve 52. These curves are static operating characteristics. The static voltage across the tunnel diode 24 must be the same as the static voltage across the emitter-base diode of the transistor 34. A combined operating characteristic of the tunnel diode 24 and the transistor 34 may be constructed therefore by adding the current through the diode 24 and into the emitter 32 of the transistor 34 at the same voltage. The combined characteristic is indicated in FIG. 2 by the solid curve 54, and includes the points *a*, *b*, *c*, *d*.

The tunnel diode 24 characteristic 50 has two regions *ab* and *ef* of positive resistance. These regions are joined by a region *be* of negative resistance. The substantially constant current $I_a$ supplied at the common junction 22 is chosen in value so that the load line 62 intersects both regions of positive resistance. The point 60 of intersection of the load line 62 with the characteristic 50 is a point of stable operation of the tunnel diode 24. The voltage across the diode 24 in this operating state is lower than the threshold of the transistor 34, and all of the current $I_a$ supplied by the constant current source then flows into the tunnel diode 24. No current flows into the emitter electrode 32 to the collector 36, and the output voltage at the collector electrode 36 is low, relatively speaking, whereupon the diode 10*d* is energized. An additional increment of current ΔI is supplied at the common junction 22 whenever the input to one of the diodes 20*a* . . . 20*c* is energized. This current increment raises the load line to the position indicated by the dashed line 62*a*. The current increment ΔI initially flows into the tunnel diode 24 because of the action of the inductor 30. The tunnel diode current increases momentarily to a value close to $I_a+\Delta I$. When the diode 24 current exceeds the peak current $I_b$, the diode 24 is switched rapidly through the negative resistance region to a condition of high voltage. The inductor 30, in tending to prevent a change in current through it, enhances the high speed of switching of the tunnel diode 24 in response to the current ΔI.

Figure 2:
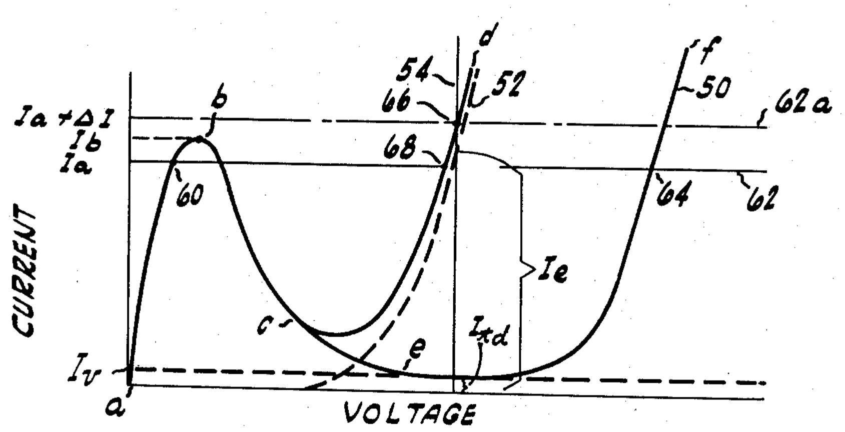
FIG. 2 is a set of volt-ampere characteristics useful in describing the operation of the FIG. 1 circuit.

The dynamic operating condition of the tunnel diode 24 during the switching transient is not easily illustrated, and no attempt is made to illustrate this condition in FIG. 2. Suffice it to say the current flows through the inductor 30 and into the emitter 32 of the transistor 34 when the tunnel diode 24 switches to the high voltage state and the threshold of the transistor 34 is exceeded. Assuming that the duration of the input current pulse is greater than the $L/R$ time constant of the inductor 30, the tunnel diode 24-transistor 34 combination stabilizes at the point 66 of intersection of the load line 62*a* and the combined operating characteristic 54 during the period of the applied input pulse. The current flowing into the tunnel diode 24 is then $I_{td}$, and the current flowing into the emitter electrode 32 is $I_e$. The emitter current $I_e$ flows almost in its entirety to the collector 36 and raises the collector voltage to a high value. As may be seen in FIG. 2, the change in emitter current $I_e$ is much greater than the change in input current ΔI; the ration $I_e/\Delta I$ is approximately the current amplification factor of the tunnel diode-transistor combination.

Assume that the input current pulse ΔI terminates after the tunnel diode 24-transistor 34 combination is stabilized at the operating point 66. The current supplied at the common junction point 22 then decreases to a value $I_a$. In the absence of the inductor 30, the tunnel diode 24 would remain in a stable state of high voltage and the operating point of the combination would be the point 68 of intersection of the combined characteristic 54 with the load line 62. The inductor 30, however, tends to oppose any change in current flowing into the emitter electrode 32. That is to say, the inductor 30 tends to maintain an emitter 32 current of $I_e$. This value of current is greater than the difference between the constant current $I_a$ and the valley current $I_v$ of the tunnel diode 24. Accordingly, the diode 24 switches rapidly through its negative resistance region to the low voltage state when the tunnel diode 24 current falls below $I_v$, and the circuit stabilizes at the operating point 60 at the termination of the switching transient.

The tunnel diode 24 has an intrinsic capacitance which may be thought of as being connected between the common junction point 22 and circuit ground. The charge stored therein must be discharged before the tunnel diode 24 reaches the low voltage operating point 60, and it is the capacitance primarily which determines the switching time of the tunnel diode 24. The $L/R$ time constant of the inductor 30 must be greater than the RC time constant of the tunnel diode 24 in order to achieve the self-resetting action aforementioned. The emitter 32 current again becomes zero after the tunnel diode 24 stabilizes at the operating point 60, and the output voltage at the collector electrode 36 goes low.

Operation of the FIG. 1 circuit may be summarized as follows. The tunnel diode 24 ordinarily is biased in the low voltage region of its operating characteristic. This voltage is less than the threshold of the transistor 34. An input current pulse of magnitude greater than $I_b-I_a$ causes the tunnel diode 24 to switch to the high voltage state. The inductor 30 enhances the high speed switching of the tunnel diode 24. The transistor 34 conducts after the tunnel diode 24 is switched to the high voltage state, and a positive-going output signal appears at the collector electrode 36. A magnetic field is built up around the inductor 30 in response to current flow therethrough and energy is stored in the magnetic field. The inductor 30 tends to prevent a decrease in emitter 32 current when the input pulse terminates. The current through the tunnel diode 24 then decreases below the valley current, and the tunnel diode 24 switches back to the low voltage state.

It will be apparent that the gate circuit comprising the diodes 20*a* . . . 20*c* may perform a different logic from that described above. For example, if energizing one diode 20*a* . . . 20*c* increases the current supplied to the common junction point 22 an amount less than $I_b-I_a$ and greater than ½ $(I_b-I_a)$, the diode gate would operate as a majority gate since the tunnel diode 24 does not switch until its peak current $I_b$ is exceeded. In this sense, then, the tunnel diode 24 operates indirectly as a logic threshold device in the FIG. 1 circuit, although it is intended primarily as a current amplifier in the given application. The transistor 34 provides voltage gain and isolation between the input and the output terminals.

Figure 3:
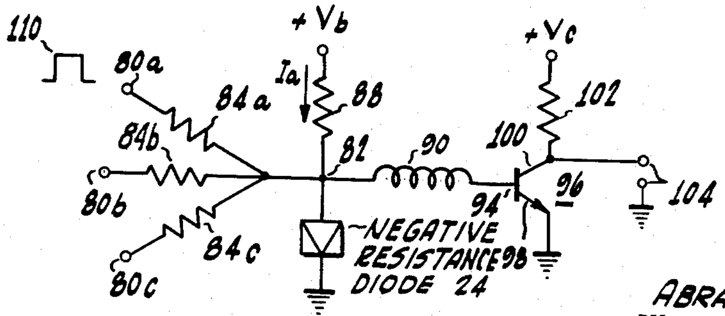
FIG. 3 is a schematic diagram of a pulse circuit wherein the tunnel diode-transistor combination performs logic, inversion, amplification and isolation between the input and output terminals.

FIG. 3 is a schematic diagram of a logic circuit wherein the tunnel diode 24 functions more nearly like a true logic threshold device and in which the conventional diode gate is eliminated. In FIG. 3, each of a plurality of input terminals 80*a* . . . 80*c* is connected to a junction point 82 at the anode of the tunnel diode 24 by a separate resistor 84*a* . . . 84*c*, respectively. Either voltage or current pulses may be applied at the input terminals. In the former case, the resistors 84a . . . 84c are selected in value to convert the voltage input signals to current pulses at the junction point 82. A resistor 88 and a source of voltage, designated $+V_b$, serve as a substantially constant current source to supply a current $I_a$ at the junction point 82.

An inductor 90 is connected between the junction point 82 and the base electrode 94 of an NPN transistor 96. The transistor 96 is connected in the common emitter configuration by connecting its emitter electrode 98 to a point of reference potential, indicated schematically by the symbol for circuit ground. The cathode of the tunnel diode 24 also is connected to ground. The collector 100 is reverse-biased with respect to the base 94 by connecting the collector electrode 100 to a source of biasing potential, designated $+V_c$, by way of a resistor 102. One of a pair of output terminals 104 is connected to the collector electrode 100; the other of the output terminals 104 is grounded.

The operation of the tunnel diode 24-transistor 96 combination in the FIG. 3 circuit is substantially the same as the operation of the tunnel diode 24-transistor 34 combination in FIG. 1 and need not be described in detail. The operating characteristic of the transistor 96 looking into the base electrode 94 may not be the same as the input characteristic of the transistor 34 (FIG. 1), but the difference generally is important only in determining the dynamic operating point of the combination after the current through the inductor 90 has reached a steady value. In certain cases, and depending upon the transistor 96 parameters, it may be desirable or necessary to connect the emitter electrode 98 to a source of voltage other than ground in order that the volt-ampere characteristic of the transistor 96 may intersect the volt-ampere characteristic of the tunnel diode 24 at such a point as to provide optimum operation, and, more particularly, to assure that the characteristic curves are so related that the current $I_e$ is greater than $I_a - I_v$ (FIG. 2). Connecting the emitter electrode 98 (FIG. 3) or the base electrode 38 (FIG. 1) to a bias potential has the effect of shifting the transistor input characteristic 52 to the left or right, depending upon the polarity of the bias.

Consider the operation of the FIG. 3 circuit when the tunnel diode 24 performs the logical "or" function. The constant current source biases the tunnel diode 24 at the point 60 of operation indicated in FIG. 2. An input pulse 110 applied at any of the input terminals 80a . . . 80c supplies an increment of current $\Delta I$ at the junction point 82. This increase in current is sufficient to switch the tunnel diode 24 to the high voltage state. The voltage across the diode 24 in the high voltage state is greater than the threshold of the transistor 96. The transistor 96 then conducts and the voltage at the output terminals 104 decreases, that is becomes less positive. Assuming that the duration of the input pulse 110 is greater than the $L/R$ constant of the constant of the inductor 90, or at least long enough to allow the inductor 90 to charge substantially, the tunnel diode 24 switches back to the low voltage state when the input pulse 110 terminates, for reasons described previously. The voltage across the tunnel diode 24 in the low voltage operating state is less than the threshold of the transistor 96, and the voltage across the output terminals 104 then rises in a positive direction.

Although the FIG. 1 circuit has been illustrated and described as employing a PNP transistor, it will be apparent to one skilled in the art that an NPN transistor could also be used provided the connections to the conventional diodes and the tunnel diode are reversed and provided further that the various biasing sources have a polarity opposite to that illustrated in the drawing. In like manner, a PNP transistor could be substituted for the transistor 96 in FIG. 3 if similar changes are made. It will also be understood that the particular types of input circuits to the tunnel diode-transistor combination which are illustrated in the drawing are by way of illustration only and constitute no limitation of the present invention.

What is claimed is:

1. A self-resetting pulse circuit comprising: a transistor having an output electrode, a control electrode and a common electrode; a junction point; an inductor connected between said control electrode and said junction point; a tunnel diode having a peak current $I_b$ and a valley current $I_v$; means connecting said tunnel diode between said junction point and said common electrode, the transistor-tunnel diode combination having a combined volt-ampere operating characteristic defined by a first region of positive resistance at relatively low voltage, a second region of positive resistance at relatively high voltage and a region of negative resistance joining the two regions of positive resistance; bias means connected at said junction point and providing a quiescent load line which intersects the combined operating characteristic in both the first and second positive resistance regions, said load line intersecting said second region at a current value $I_a < I_b$; means connected at said junction point for applying a pulse of current of sufficient magnitude to switch the operating point on said combined characteristic from the first to the second positive resistance region and provide a control current $I_e > I_a - I_v$ for said transistor, the time required for the current through said inductor to reach the value $I_e$ being greater than the switching time of said tunnel diode and less than the duration of the current pulse; and output means connected at said output electrode.

2. A self-resetting pulse circuit comprising: a transistor having a collector electrode, a base electrode and an emitter electrode; a junction point; an inductor connected between said base electrode and said junction point; a tunnel diode having a peak current $I_b$ and a valley current $I_v$; means connecting said tunnel diode between said junction point and said emitter electrode, the tunnel diode being connected to conduct forward current in the same direction, relative to said junction point, as the direction of forward base current, the transistor-tunnel diode combination having a combined volt-ampere operating characteristic defined by a first region of positive resistance at relatively low voltage, a second region of positive resistance at relatively high voltage and a region of negative resistance joining the two regions of positive resistance; bias means connected at said junction point and providing a quiescent load line which intersects the combined operating characteristic in both the first and second positive resistance regions, said load line intersecting said second region at a current value $I_a < I_b$; means connected at said junction point for applying a pulse of current of sufficient magnitude to switch the operating point on said combined characteristic from the first to the second positive resistance region and provide a forward base current $I_e > I_a - I_v$, the time required for the current through said inductor to reach the value $I_e$ being greater than the switching time of said tunnel diode and less than the duration of the current pulse; and output means connected at said collector electrode.

3. A self-resetting pulse circuit comprising: a transistor connected in a common base configuration and having a collector electrode and an emitter electrode; a junction point; an inductor connected between said emitter electrode and said junction point; a tunnel diode having a peak current $I_b$ and a valley current $I_v$; means connecting said tunnel diode between said junction point and the base electrode, the tunnel diode being connected to conduct forward current in the same direction, relative to said junction point, as the direction of forward emitter current, the transistor-tunnel diode combination having a combined volt-ampere operating characteristic defined by a first region of positive resistance at relatively low voltage, a second region of positive resistance at relatively high voltage and a region of negative resistance joining the two regions of positive resistance; bias means connected at said junction point and providing a quiescent load line which intersects the combined operating characteristic in both the first and second positive resistance regions, said load line intersecting said second region at a current value $I_a<I_b$; means connected at said junction point for applying a pulse of current of sufficient magnitude to switch the operating point on said combined characteristic from the first to the second positive resistance region and provide a forward emitter current $I_e>I_a-I_v$, said inductor having an inductive time constant greater than the switching time of said tunnel diode and less than the duration of the current pulse; and output means connected at said collector electrode.

4. A self-resetting pulse circuit comprising: a transistor having an output electrode, a control electrode and a common electrode; a junction point; an inductor connected between said control electrode and said junction point; a tunnel diode having a peak current $I_b$ and a valley current $I_v$; means connecting said tunnel diode between said junction point and said common electrode, the combined volt-ampere operating characteristic of the transistor-tunnel diode combination having a first region of positive resistance at relatively low voltage, a second region of positive resistance at relatively high voltage and a region of negative resistance joining the first and second postive resistance regions; bias means connected at said junction point and providing a quiescent load line which intersects said combined characteristic in both the first and second regions, the intersection of the quiescent load line with said second region corresponding to a tunnel diode current of approximately $I_v$; means connected at said junction point for applying a pulse of current of sufficient magnitude to exceed the peak current $I_b$ of said tunnel diode, said inductor having an inductive time constant greater than the switching time of the tunnel diode and less than the duration of said current pulse; and output means connected at said output electrode.

5. A self-resetting pulse circuit comprising: a transistor connected in the common emitter configuration and having a collector electrode and a base electrode; a junction point; an inductor connected between said base electrode and said junction point; a tunnel diode having a peak current $I_b$ and a valley current $I_v$; means connecting said tunnel diode between said junction point and the emitter electrode, the tunnel diode being connected to conduct forward current in the same direction, relative to said junction point, as the direction of forward base current, the combined volt-ampere operating characteristic of the transistor-tunnel diode combination having a first region of positive resistance at relatively low voltage, a second region of positive resistance at relatively high voltage and a region of negative resistance joining the first and second positive resistance regions; bias means connected at said junction point and providing a quiescent load line which intersects said combined characteristic in both the first and second regions, the intersection of the quiescent load line with said second region corresponding to a tunnel diode current of approximately $I_v$; means connected at said junction point for applying a pulse of current of sufficient magnitude to exceed the peak current $I_b$ of said tunnel diode, said inductor having an inductive time constant greater than the switching time of the tunnel diode and less than the duration of said current pulse; and output means connected at said collector electrode.

6. A self-resetting pulse circuit comprising: a transistor connected to the common base configuration and having a collector electrode and an emitter electrode; a junction point; an inductor connected between said emitter electrode and said junction point; a tunnel diode having a peak current $I_b$ and a valley current $I_v$; means connecting said tunnel diode between said junction point and said base electrode, the tunnel diode being connected to conduct forward current in the same direction, relative to said junction point, as the direction of forward emitter current, the combined volt-ampere operating characteristic of the transistor-tunnel diode combination having a first region of positive resistance at relatively low voltage, a second region of positive resistance at relatively high voltage and a region of negative resistance joining the first and second positive resistance regions; bias means connected at said junction point and providing a quiescent load line which intersects said combined characteristic in both the first and second regions, the intersection of the quiescent load line with said second region corresponding to a tunnel diode current of approximately $I_v$; means connected at said junction point for applying a pulse of current of sufficient magnitude to exceed the peak current $I_b$ of said tunnel diode, said inductor having an inductive time constant greater than the switching time of the tunnel diode and less than the duration of said current pulse; and output means connected at said collector electrode.

References Cited in the file of this patent

Todd, C. D.: "Tunnel Diode Applications," Application Engineering Notes, Hughes Semiconductor Division, May 1960.

Todd, C. D.: "Combining Transistors With Tunnel Diodes," Electronics, page 59, August 19, 1960.